United States Patent
Kawashima et al.

(10) Patent No.: US 9,573,537 B2
(45) Date of Patent: Feb. 21, 2017

(54) WIRING UNIT FOR AUTOMATIC TRANSMISSION

(71) Applicant: Sumitomo Wiring Systems, Ltd., Yokkaichi, Mie (JP)

(72) Inventors: Yuji Kawashima, Mie (JP); Mitsuhiro Shimamura, Mie (JP); Satoru Itou, Mie (JP)

(73) Assignee: SUMITOMO WIRING SYSTEMS, LTD., Yokkaichi-Mie (JP)

( * ) Notice: Subject to any disclaimer, the term of this patent is extended or adjusted under 35 U.S.C. 154(b) by 0 days.

(21) Appl. No.: 14/779,025

(22) PCT Filed: Mar. 10, 2014

(86) PCT No.: PCT/JP2014/056168
§ 371 (c)(1),
(2) Date: Sep. 22, 2015

(87) PCT Pub. No.: WO2014/156591
PCT Pub. Date: Oct. 2, 2014

(65) Prior Publication Data
US 2016/0052469 A1 Feb. 25, 2016

(30) Foreign Application Priority Data
Mar. 29, 2013 (JP) ................. 2013-073706

(51) Int. Cl.
*B60R 16/02* (2006.01)
*B60R 16/023* (2006.01)
(Continued)

(52) U.S. Cl.
CPC ....... *B60R 16/0231* (2013.01); *B60R 16/0215* (2013.01); *H05K 1/0296* (2013.01);
(Continued)

(58) Field of Classification Search
USPC ............................................ 174/154; 248/68
See application file for complete search history.

(56) References Cited

U.S. PATENT DOCUMENTS 4,790,204 A    12/1988   Tury et al.
5,388,028 A *   2/1995   Arbanas ................ H01L 23/66
                                                                                                                     257/E25.026
(Continued)

FOREIGN PATENT DOCUMENTS

JP         5-503564       6/1993
JP       2005-212722       8/2005
(Continued)

OTHER PUBLICATIONS

International Search Report.

*Primary Examiner* — Dhirubhai R Patel
(74) *Attorney, Agent, or Firm* — Gerald E. Hespos; Michael J. Porco; Matthew T. Hespos

(57) ABSTRACT

A wiring unit (U) for automatic transmission mounted in an automatic transmission of an automotive vehicle and configured to execute a control relating to a speed changing operation includes a wiring harness (WH), a ROM (1) connected to the wiring harness and a holding plate (2) made of metal for holding these. The holding plate (2) is formed with a holding portion (33) on which the ROM (1) is to be placed, and the holding portion (33) is integrally formed with a plurality of swaging pieces (36) for fixing the ROM (1) on the holding portion (33) by being swaged to the ROM (1). Further, the ROM (1) is formed with a positioning protrusion (37), and the holding portion (33) is formed with a receiving hole (39) into which the positioning protrusion (37) is aligned and fitted.

4 Claims, 12 Drawing Sheets

(51) Int. Cl.
*H05K 1/02* (2006.01)
*H05K 1/05* (2006.01)
*H05K 1/18* (2006.01)
*H05K 7/02* (2006.01)

(52) U.S. Cl.
CPC ............... *H05K 1/05* (2013.01); *H05K 1/181* (2013.01); *H05K 7/02* (2013.01); *H05K 2201/09009* (2013.01)

(56) References Cited

U.S. PATENT DOCUMENTS

| | | | |
|---|---|---|---|
| 7,297,874 B2 * | 11/2007 | Yasuda | ............... B60R 16/0215 174/135 |
| 8,134,075 B1 * | 3/2012 | Vail | .......................... H02G 3/14 174/135 |
| 2005/0167183 A1 | 8/2005 | Tominaga et al. | |
| 2008/0006515 A1 | 1/2008 | Mitsui et al. | |
| 2009/0025974 A1 | 1/2009 | Chen et al. | |

FOREIGN PATENT DOCUMENTS

| | | |
|---|---|---|
| JP | 2006-144835 | 6/2006 |
| JP | 2008-13012 | 1/2008 |
| JP | 2009-32405 | 2/2009 |
| JP | 2010-106946 | 5/2010 |

* cited by examiner

WIRING UNIT FOR AUTOMATIC TRANSMISSION

BACKGROUND

1. Field of the Invention

The present invention relates to a wiring unit for automatic transmission.

2. Description of the Related Art

Conventionally, electrical components such as control components (ROM, etc.) and various sensors and a wiring unit formed by unitizing electrical wiring for signal transmission among these electrical components or external signal transmission are assembled, for example, into an automatic transmission of an automotive vehicle to control a speed changing operation. A wiring unit having such a configuration is known from Japanese Unexamined Patent Publication No. 2010-106946.

Aside from the above one, a wiring unit may be so configured that electrical components and a wiring harness are assembled on a holding plate made of metal. In such a case, a ROM 101 may be held on a holding plate 100 as shown in FIG. 13. As shown in FIG. 13, the ROM 101 is fixed to the holding plate 100 via a holder 102. In fixing the ROM 101, the holder 102 is first fixed on the holding plate 100 with rivets 103. Thereafter, the ROM 101 is placed on the holder 102 and fixed by swaging each swaging piece 104.

However, if such a fixing method is adopted, a dedicated component called the holder 102 is necessary to mount the ROM 101, thereby presenting a problem of increasing the number of components.

The present invention was completed based on the above situation and aims to provide a wiring unit for automatic transmission capable of reducing the number of components.

SUMMARY

A wiring unit for automatic transmission of the present invention is a wiring unit for automatic transmission mounted in an automatic transmission of an automotive vehicle and configured to execute a control relating to a speed changing operation and includes electrical wiring, an electrical component connected to the electrical wiring, and a holding plate made of metal for holding the electrical wiring and the electrical component, wherein the holding plate is formed with a holding portion on which the electrical component is to be placed, and the holding portion is integrally formed with a swaging piece for fixing the electrical component on the holding portion by being swaged to the electrical component, a positioning protrusion projects on one of the holding portion and the electrical component and the other is formed with a receiving portion into which the positioning protrusion is fitted to position the electrical component, the receiving portion is closed on the entire circumference, a plurality of the swaging pieces are arranged to sandwich the electrical component on one and the other side edges of the holding portion, the swaging pieces provided on the one side edge and those provided on the other side edge differ in number and the receiving portion is arranged at a position of the holding portion near the side edge with fewer swaging pieces.

According to the wiring unit for automatic transmission of the present invention, the electrical component is fixed by swaging the swaging piece integrally formed to the holding portion. Thus, unlike before, a dedicated component for fixing the electrical component is not necessary and the number of components can be reduced.

Further, since the positioning protrusion projects on one of the electrical component and the holding portion and the other is formed with the receiving portion into which the positioning protrusion is fitted to position the electrical component, the electrical component can be positioned on the holding plate by fitting the positioning protrusion and the receiving portion prior to a swaging operation. In this way, the burden of holding the electrical component during the swaging operation is released and a satisfactory swaged state is obtained.

Further, since the positioning protrusion or the receiving portion is arranged near the holding plate, a situation of erroneous assembling where the electrical component is erroneously assembled in an inverted manner can be avoided.

DETAILED DESCRIPTION

Preferred embodiments of the present invention are described.

In the wiring unit for automatic transmission of the present invention, each swaging piece may be formed of a base portion standing from the holding portion and a swaging portion formed to be somewhat narrow at a tip side of the base portion and swageable to the electrical component.

Since the narrow swaging portion is formed on the tip of the base portion of each swaging piece in this way, swaging can be performed with a relatively light operation force while the electrical component is sandwiched.

Furthermore, the holding plate may include a free end part arranged via a bent portion, the holding portion may be formed on the free end part and the bent portion may be formed with a reinforcing rib in an area straddling the bent portion.

According to such a configuration, a bending force acts on the holding portion with the bent portion as a center if the swaging piece is swaged to the electrical component. At that time, since the bending rigidity of the bent portion is enhanced by the reinforcing rib, a situation where the holding plate is deformed as swaging is performed can be avoided.

Next, a specific embodiment of a wiring unit for automatic transmission of the present invention is described with reference to the drawings.

Figure 1:
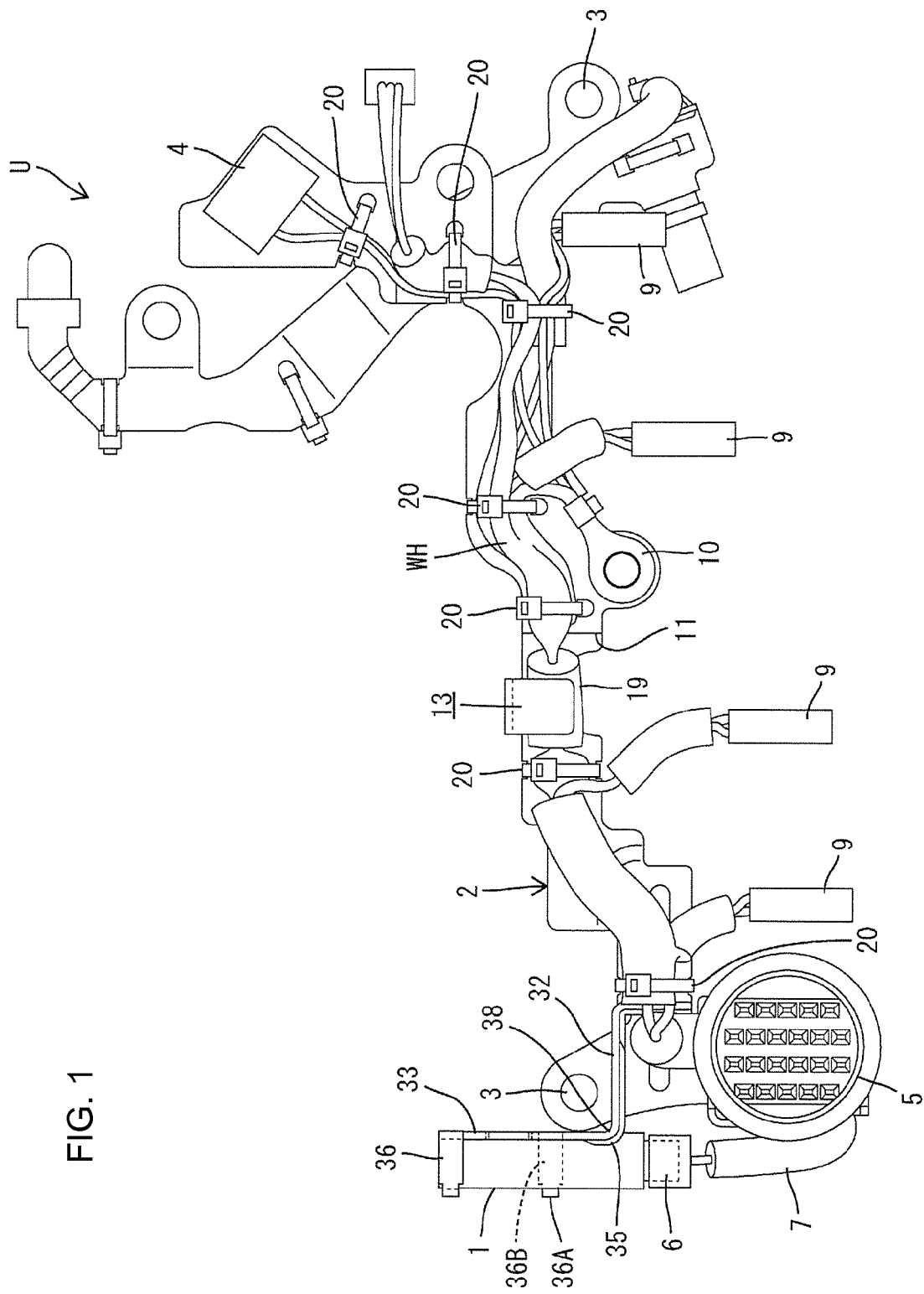
FIG. 1 is a plan view of a wiring unit.
Figure 2:
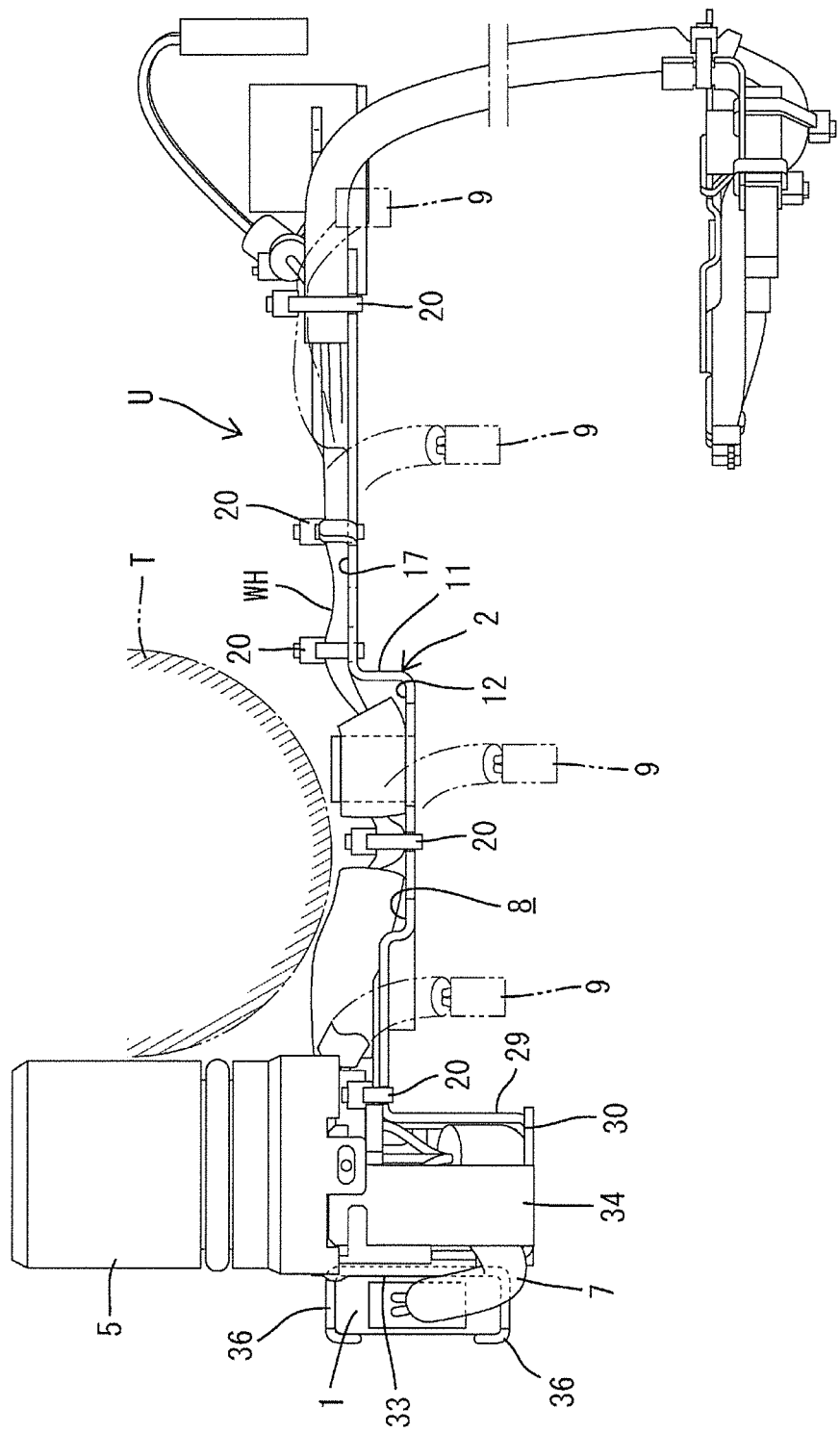
FIG. 2 is a front view of the wiring unit.
Figure 3:
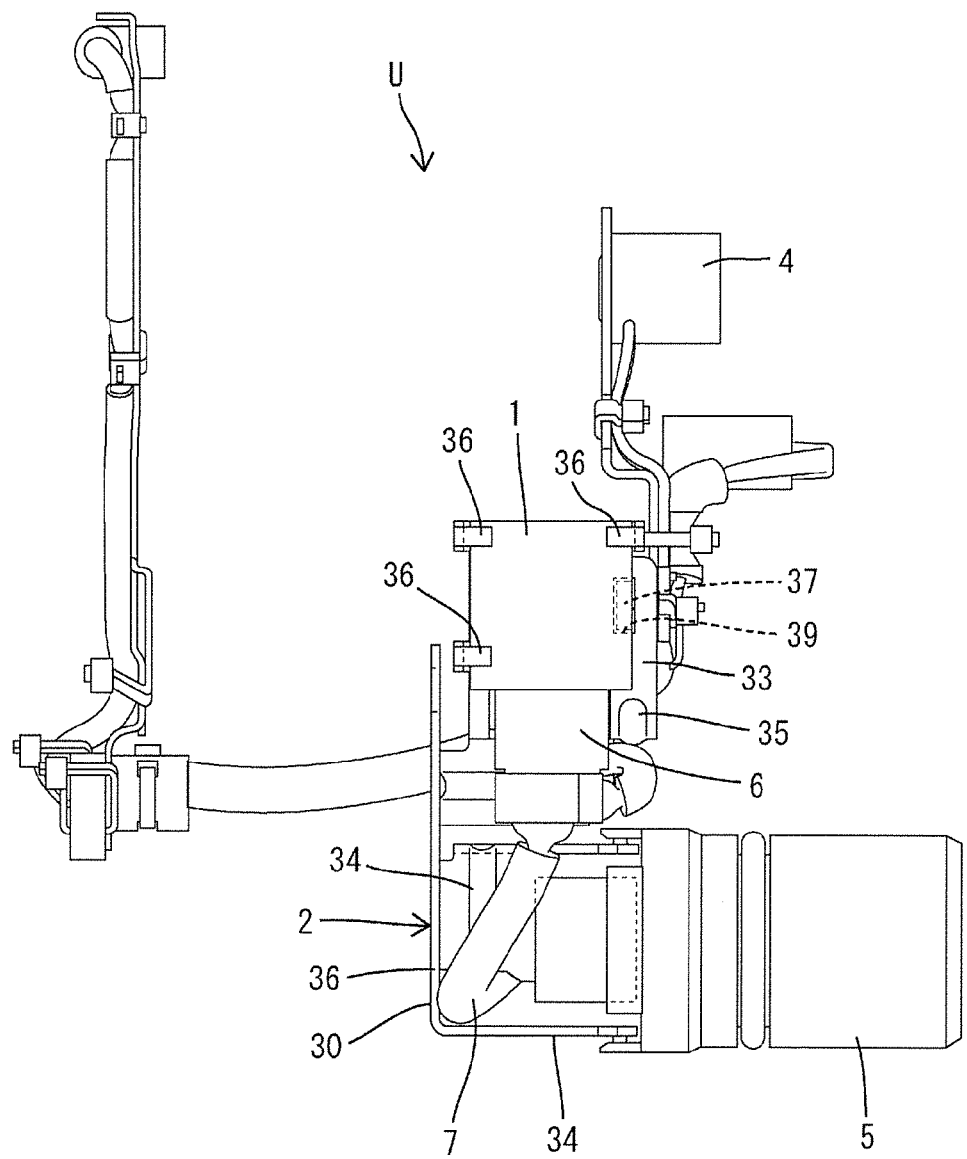
FIG. 3 is a side view of the wiring unit.

A wiring unit U for automatic transmission of this embodiment is mounted in an automatic transmission of an automotive vehicle and in charge of a part of a control relating to a speed changing operation. As shown in FIGS. 1 to 3, the wiring unit U includes various electrical components such as a ROM 1 and connectors, a wiring harness WH composed of a plurality of wires for connecting the electrical components and the like to each other and a holding plate 2 made of metal for collectively holding these electrical components and wiring harness WH.

Figure 4:
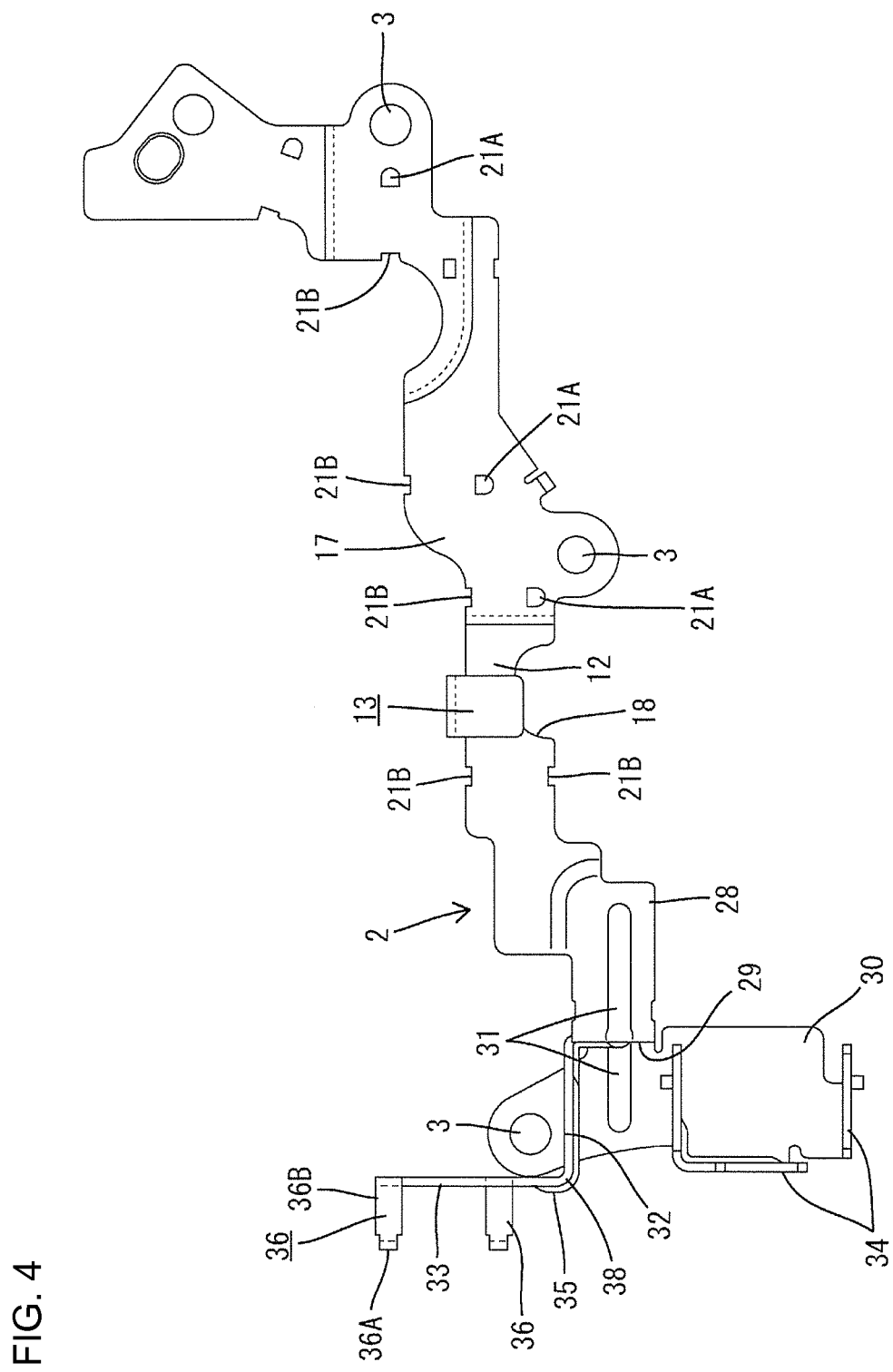
FIG. 4 is a plan view of a holding plate.
Figure 5:
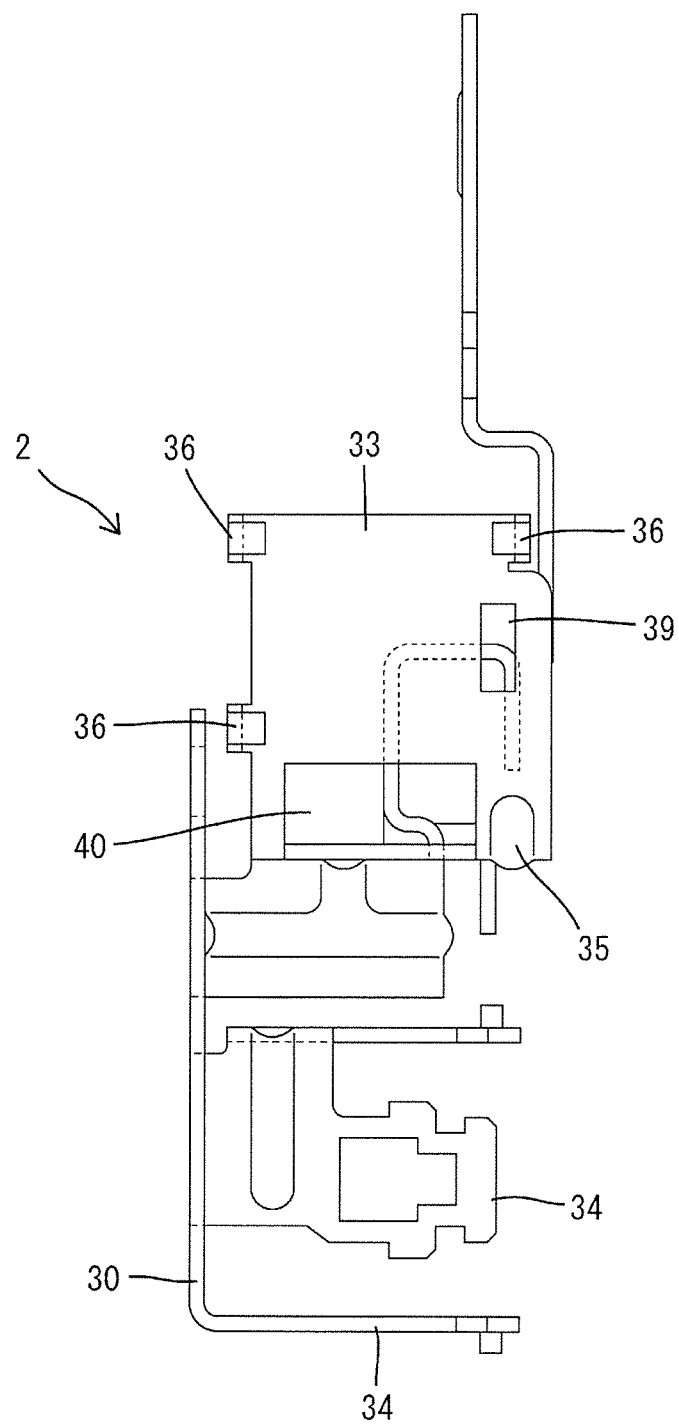
FIG. 5 is a side view of the holding plate.
Figure 6:
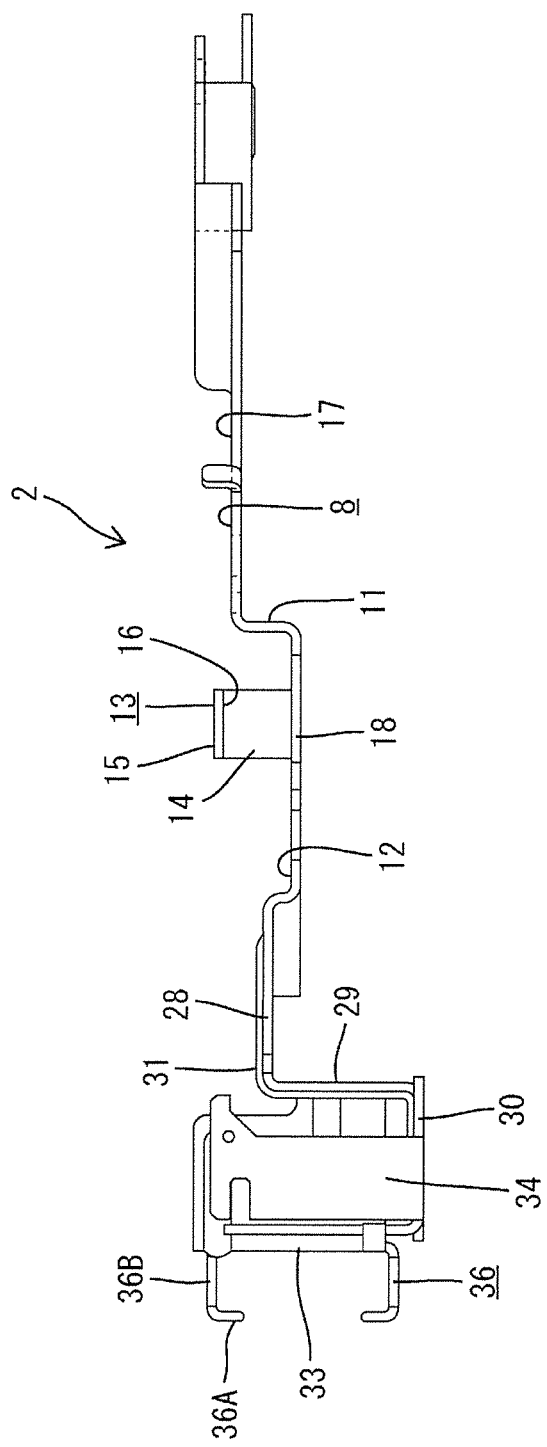
FIG. 6 is a front view of the holding plate.

As shown in FIGS. 4 to 6, the holding plate 2 is formed by bending a long metal plate material. The holding plate 2 is mounted on a casing of the unillustrated automatic transmission by bolts or the like, and formed with bolt insertion holes 3 penetrating at two positions near opposite lengthwise end parts and at an intermediate part, i.e. at a total of three positions in a shown example.

As shown in FIG. 1, an end connector 4 is arranged on a shown right end part of the holding plate 2. On the other hand, a shown left end part of the holding plate 2 is forked into two directions, an intermediate connector 5 connected to a control device and the like is arranged on one end part and the ROM 1 storing data relating to the speed changing operation is arranged on the other end part. A mounting structure for the ROM 1 is described in detail later. One end side of a wire 7 is connected to the ROM 1 via a connector 6, and the other end side of the wire 7 is connected to the intermediate connector 5. The wiring harness WH composed of the plurality of wires including this wire 7 is pulled out from the intermediate connector 5, and a main line thereof is laid along a support surface 8 formed on the upper surface of the holding plate 2. Branch lines are branched at a plurality of positions of the main line. A connector 9 connected to an unillustrated solenoid is connected to each of the branch lines pulled out at shown four positions out of those branch lines. Further, the branch lines pulled out at other positions are connected to the above end connector 4, and a ground terminal 10 is mounted on branch lines pulled out at further other positions and grounded by screwing a bolt into the bolt insertion hole 3 arranged in the center out of the above bolt insertion holes 3.

As shown in FIG. 6, the holding plate 2 is horizontally formed to have substantially the same flat surface in a range from a mounted position of the above end connector 4 to a longitudinal central part. A step 11 is formed on a part of the holding plate 2 to the left of and adjacent to the part where the bolt insertion hole 3 is formed for grounding, and a part of the holding plate 2 to the left of the step 11 is one level lower. This one level lower part of the holding plate 2 serves as a low-level area 12, and a pressing portion 13 for regulating the lift of the main line part of the wiring harness WH is provided in this low-level area 12.

Figure 8:
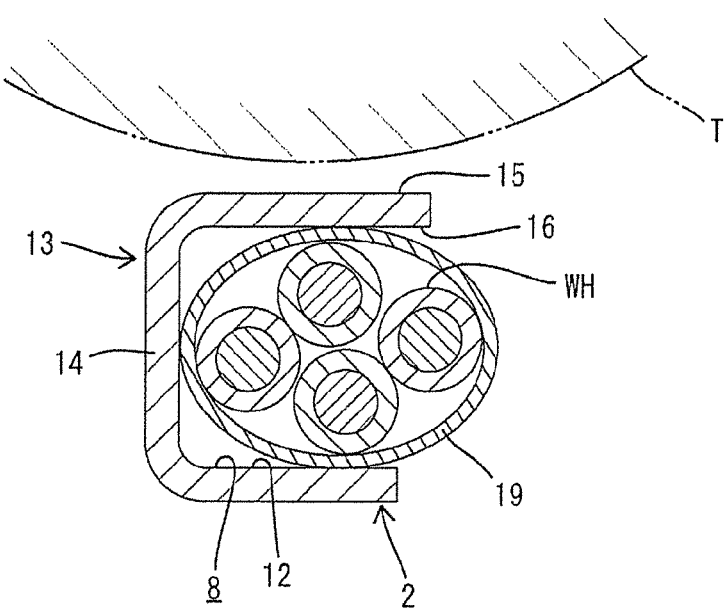
FIG. 8 is a section showing a state where a wiring harness is held by a pressing portion.

The pressing portion 13 is integrally formed to the holding plate 2. Specifically, as shown in FIG. 8, the pressing portion 13 is composed of a side piece 14 standing toward an upper surface side from one longitudinal side edge of the support surface 8 and a pressing piece 15 bent substantially at a right angle from the standing end edge of the side piece 14 and extending substantially parallel to the support surface 8, and is inverted L-shaped as a whole. A pressing surface 16 for the wiring harness WH is formed on the inner surface of the pressing piece 15. The pressing surface 16 is formed to have a predetermined length in a laying direction of the wiring harness WH and designed to be able to press the wiring harness WH in a surface contact state over a certain length range. Further, a height position of the pressing surface 16 with respect to the support surface 8 is set to be substantially at the same height as the upper surface of a high-level area 17 formed to the right of the step 11. Note that, out of opposite longitudinal side edges of the holding plate 2, the side edge opposite to the one where the pressing portion 13 is formed is cut to form a curved escaping recess 18, and a tip part of the pressing piece 15 is located in the escaping recess 18 in a plan view as shown in FIG. 4.

The main line of the wiring harness WH is inserted through protection tubes 19 (protecting members) at a plurality of separate positions. The protection tube 19 is also used at the part where the lift is regulated by the above pressing portion 13. The protection tube 19 used here is longer than the pressing portion 13 so that coatings of the wires are not damaged by the end edges of the pressing portion 13 (fractured surfaces may be edgy). The protection tube 19 is formed of a flexible rubber material and the wiring harness WH is held by being somewhat press-fitted between the pressing surface 16 and the support surface 8 while being inserted through the protection tube 19. Note that, as shown in FIGS. 2 and 8, a projection structure T on the side of the casing is proximately located above the pressing piece 15 in a state where the holding plate 2 is mounted on the unillustrated casing of the automatic transmission.

Further, the wiring harness WH is tied by tie bands 20 and fixed to the holding plate 2 at opposite sides of the pressing portion 13 (protection tube 19) in the longitudinal direction (see FIG. 1). As shown in FIG. 1, parts of the wiring harness WH tied with the tie bands 20 are both exposed parts outside the protection tube 19. One of the tie bands 20 located at the opposite sides of the pressing portion 13 is arranged in the high-level area 17 proximate to the step 11 and the other is arranged in the low-level area 12 to the left of the pressing portion 13. In this embodiment, the parts of the wiring harness WH fixed by the tie bands 20 are set at a plurality of positions besides the above parts at the opposite sides of the pressing surface 13. At any position, a pair of through holes 21A, 21B are provided to penetrate through the holding plate 2. At all the positions of the pairs of through holes 21A, 21B except at two positions (through holes 21A, 21B are arranged to the left of and adjacent to the pressing portion 13 in FIG. 4 at one position out of these two positions), one through hole 21A has a closed hole edge and the other through hole 21B is formed by cutting the edge of the holding plate 2 into a rectangular shape and open sideways. As just described, although a concept meaning not only a closed hole edge, but also including an open hole edge is applied to the through hole 21B, this does not eliminate at all a mode in which the pair of through holes have both a closed hole edge.

Figure 9:
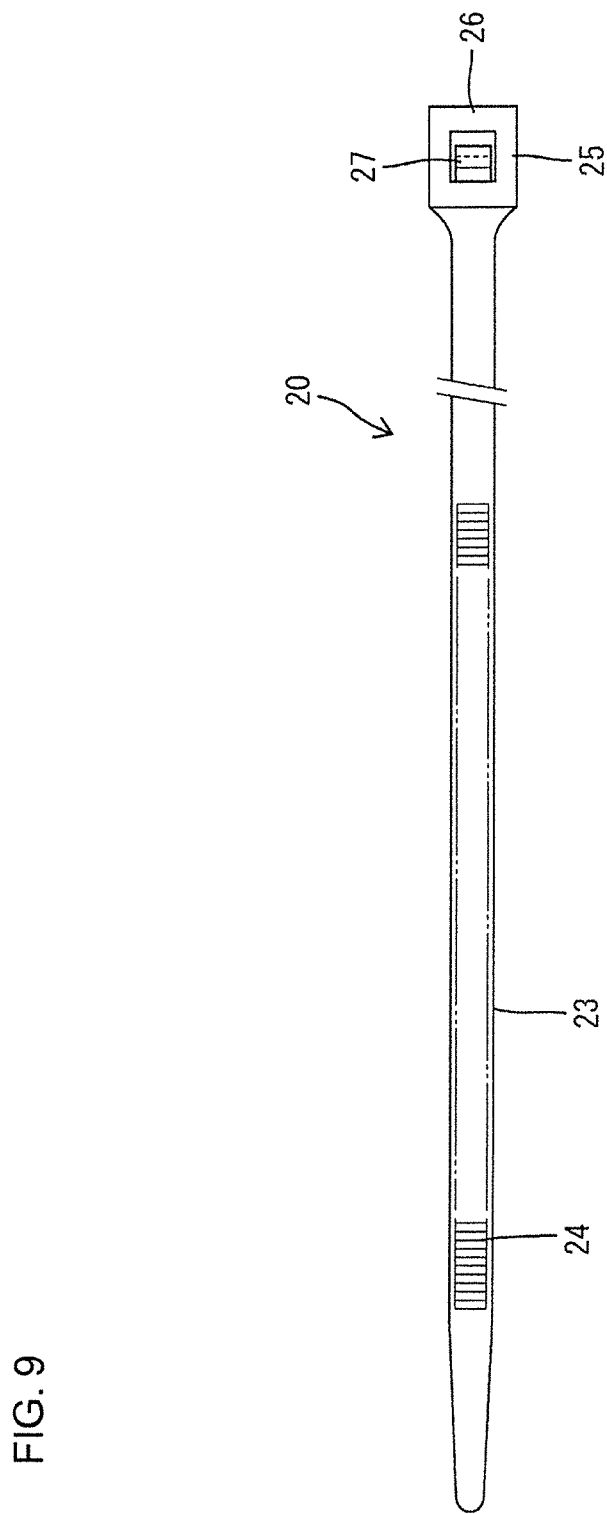
FIG. 9 is a plan view of a tie band.
Figure 10:
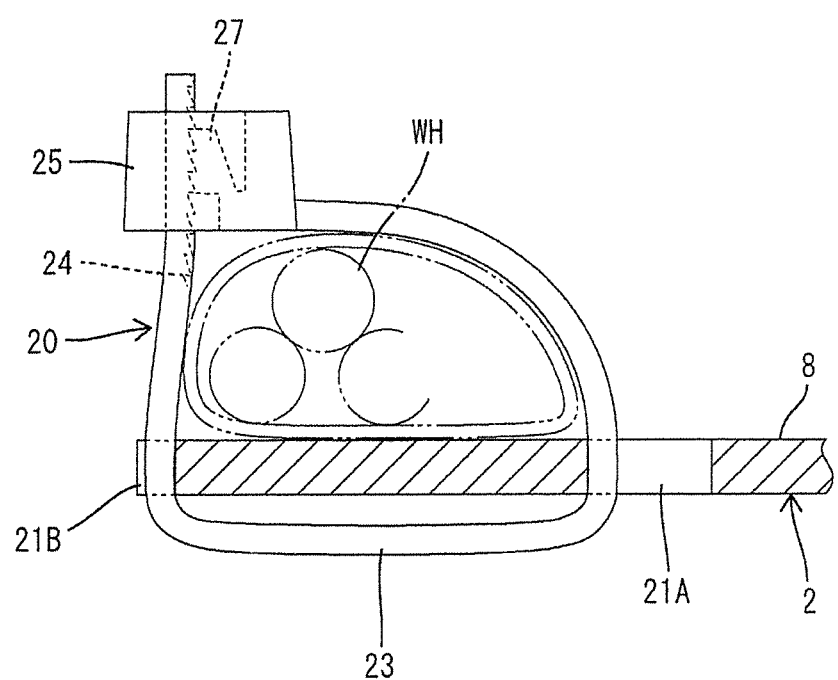
FIG. 10 is a section showing a state where the wiring harness is tied by the tie band.
Figure 12:
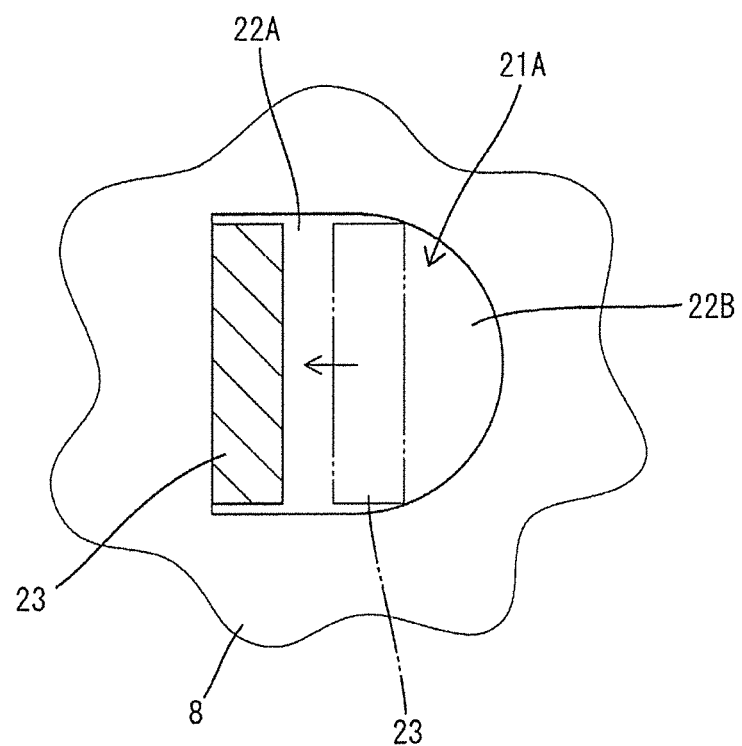
FIG. 12 is a section showing a positional relationship of an early-inserted hole and a band portion in a tied state of the wiring harness.
Figure 13:
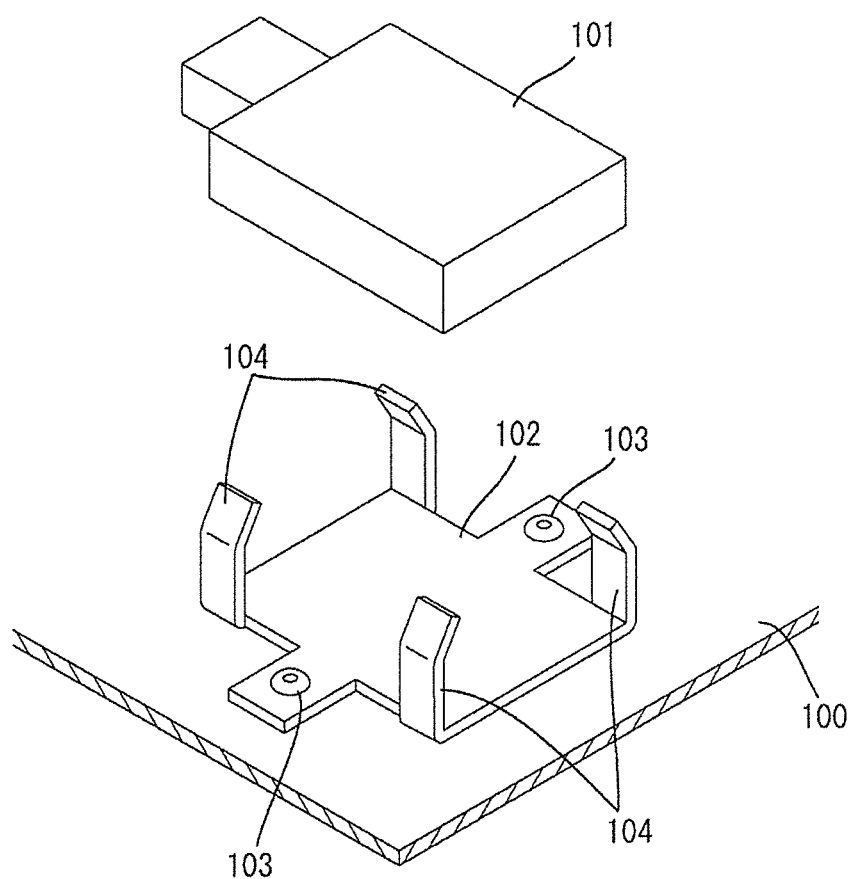
FIG. 13 is a perspective view showing a conventional ROM mounting structure.

The through hole with the closed hole edge out of the through holes 21A, 21B of this embodiment is formed by uniting a rectangular area 22A (general part) and a substantially semicircular area 22B (extended part for identification) as shown in FIG. 12. The reason of such a hole shape is described in detail later. The tie band 20 is first described. Since the tie band 20 itself is known, it is only briefly described (see FIG. 9).

The tie band 20 is made of synthetic resin and includes a flexible band portion 23 and a lock portion 25 formed on one end side of the band portion 23. A multitude of locking teeth 24 are formed in a sawtooth manner over a predetermined length range only on one surface of the band portion 23. On one end part of the band portion 23, the lock portion 25 projects on an end part of a surface opposite to the one where the locking teeth 24 are formed. An insertion opening 26 is formed to penetrate in a projecting direction in a central part of the lock portion 25 and the band portion 23 can be inserted into the insertion opening 26 with a free end side in the lead. Further, a locking claw 27 capable of selectively locking an arbitrary locking tooth 24 is deflectably provided in the lock portion 25.

Figure 11A:
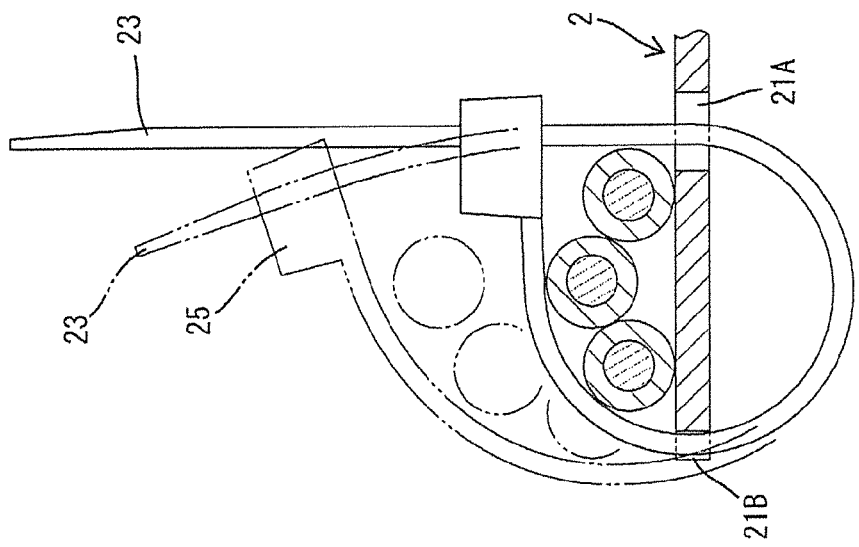
FIG. 11(A) is a diagram showing a case where the band portion is inserted through a pair of through holes in a proper insertion sequence and FIG. 11(B) is a diagram showing a case where the tie band is inserted in a wrong insertion sequence.
Figure 11B:
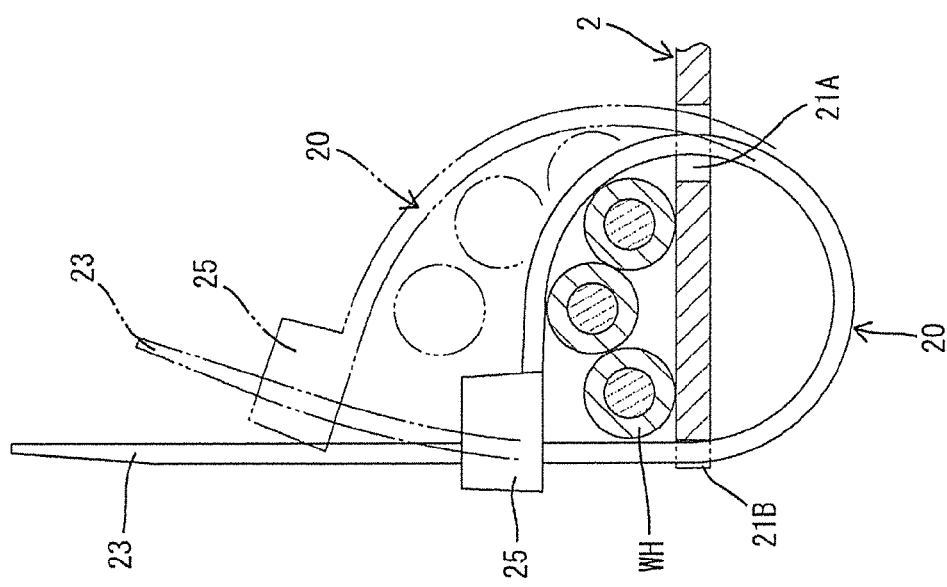

The reason why two types of modes, i.e. a closed hole edge mode and an open hole edge mode are set for the pair of through holes 21A, 21B is to distinguish into which of the through holes 21A, 21B the free end of the band portion 23 of the tie band 20 should be first inserted (see FIGS. 11(A) and 11(B)). If the free end side of the band portion 23 of the tie band 20 is inserted into the pair of through holes 21A, 21B in a wrong insertion sequence, a pulling direction of the lock portion 25, i.e. a pulling direction of the wiring harness WH as tying is performed is opposite to a proper direction (direction shown in FIG. 11(A)) and the wiring harness WH may interfere with surrounding members. However, if the tie band 20 is inserted in a correct insertion sequence, the wiring harness WH can be held by being pulled toward a retraction space free from interference with surrounding members. In the case of this embodiment, the through hole with the closed hole edge is the early-inserted hole 21A and the one with the open hole edge is the later-inserted hole 21B. The semicircular area 22B of the early-inserted hole 21A is arranged on a side opposite to the side toward which the wiring harness WH is pulled (side indicated by an arrow shown in FIG. 12) when being tied with the tie band 20. Thus, the band portion 23 is located on the side of the rectangular area 22A of the early-inserted hole 21A and the side of the semicircular area 22B is wide open in a state where the wiring harness WH is properly tightened and fixed by the tie band 20. Thus, it can be visually confirmed that a tying operation of the tie band 20 has been properly performed if this wide semicircular area 22B can be looked through in a plan view (or underside view) of the holding plate 2. Note that a tightening operation by the tie band 20 is performed by pulling upwardly the band portion 23 having passed through the lock portion 25 using a tool, and a part of the band portion 23 passed through the lock portion 25 is cut off by a cutter or the like after tightening.

As shown in FIG. 6, a crank portion 28 (see FIG. 4) extends via a part set to have a smaller height difference than the step 11 on a part of the holding plate 2 to the left of the low-level area 12. The upper end of a step wall 29 having a larger height difference than the step 11 is connected to an extending end part of the crank portion 28 as shown in FIG. 6, and an intermediate connector mounting portion 30 continuously extends to bulge out sideways from the lower end of the step wall 29 as shown in FIG. 4. A reinforcing elongated projection 31 is provided along a step direction in a range from the upper surface of the crank portion 28 to the intermediate connector mounting portion 30, thereby enhancing the bending rigidity of this part. Further, a supporting piece 34 is formed to stand upward on the intermediate connector mounting portion 30, so that the intermediate connector 5 can be supported while being surrounded on three sides.

One side edge of the above step wall 29 is bent to the left of FIG. 4 and a coupling piece 32 extends. An extending end part of this coupling piece 32 is bent substantially at a right angle to an outer lateral side via a bent portion 38 and serves as a free end part. A holding portion 33 for mounting the ROM 1 is formed on this free end part. As shown in FIG. 5, an opening 40 is formed in a central part of the holding portion 33 near the bent portion so as not to interfere with a connecting part of the connector 6 to the ROM 1. Further, the bent portion 38 is formed with a reinforcing rib 35 in a range from the coupling piece 32 to the holding portion 33 to enhance the bending rigidity of the holding portion 33.

As shown in FIGS. 4 to 6, a plurality of swaging pieces 36 are formed to integrally stand on the holding portion 33. In this embodiment, two swaging pieces 36 are arranged on one side edge of the holding portion 33 and one swaging piece 36 is arranged on the other side edge. Two of these swaging pieces 36 are arranged to face each other at opposite corner parts of a tip side of the holding portion 33. As shown in FIG. 4, a tip part of each swaging piece 36 serves as a somewhat narrow swaging portion 36A, which is inclined obliquely inwardly with respect to the side of a base portion 36B before being swaged to the ROM 1 (see FIG. 6). Thus, after moving along the upper surface of the holding portion 33 from the side of the bent portion 38, the ROM 1 is fixed to the holding portion 33 by swaging the swaging portions 36A.

Figure 7:
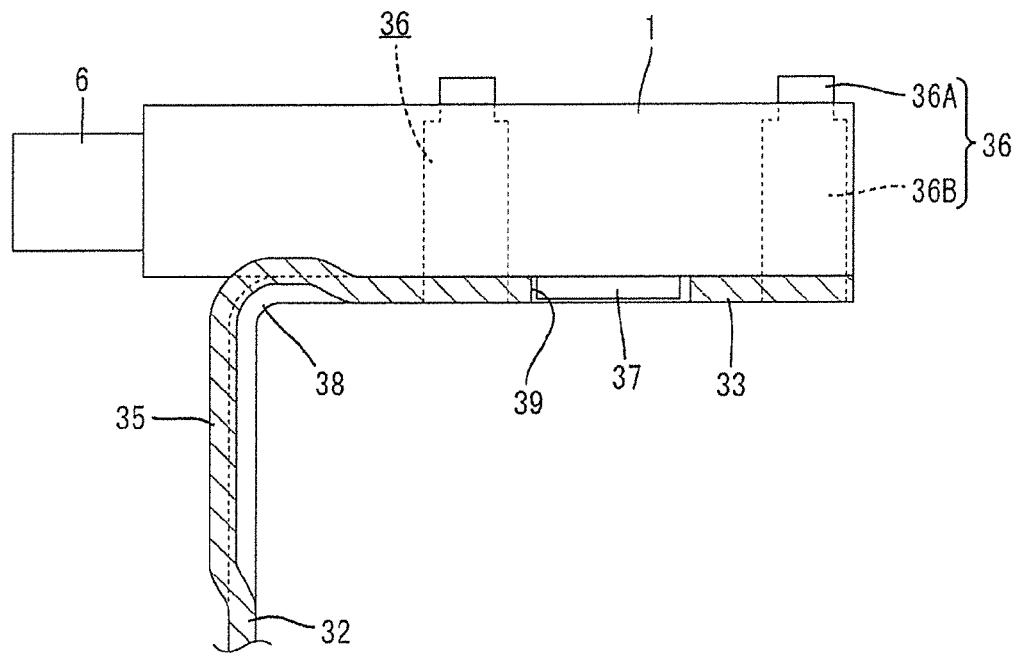
FIG. 7 is a section showing a mounted state of a ROM.

Further, in this embodiment, a positioning protrusion 37 projects on the lower surface (surface facing the holding portion 33) of the ROM 1 (see FIG. 7). On the other hand, a rectangular receiving hole 39 (receiving portion) is formed to be open at a position of the holding portion 33 near one side edge (side edge on which only one swaging piece 36 is arranged) and proximate to this swaging piece 36, and the ROM 1 can be positioned with respect to the holding portion 33 before a swaging operation by aligning and fitting the positioning protrusion 37 into the receiving hole 39.

The wiring unit U of this embodiment configured as described above is assembled into the automatic transmission in a state where the electrical components such as the ROM 1 and the connectors 4, 6 and 9 and the wiring harness WH are assembled with the holding plate 2 and unitized in advance. Functions and effects of the wiring unit U of this embodiment are as follows.

In fixing the ROM 1 to the holding plate 2, the number of components can be reduced than before since each swaging piece 36 is integrally formed to the holding plate 2 and the ROM 1 can be directly fixed to the holding plate 2. Further, the ROM 1 is positioned with respect to the holding portion 33 by aligning and fitting the positioning protrusion 37 into the receiving hole 39. Since the swaged positions for the ROM 1 are specified at proper positions in this way, the swaged positions do not vary. Further, in performing the swaging operation for the ROM 1, a bending force acts on the holding portion 33 with the bent portion as a center. However, since the bending rigidity of the bent portion is enhanced by the reinforcing rib 35, a situation where the holding plate 2 is deformed as swaging is performed is avoided.

The lift of the wiring harness WH is regulated by a simple structure, i.e. the pressing portion 13 integrally formed to the holding plate 2. Thus, in a place where a certain structure is present above the wiring harness WH, the interference of the wiring harness WH and the structure can be avoided by arranging the pressing portion 13. Further, since the pressing portion 13 presses the wires in a predetermined range extending along the laying direction by the pressing surface 16, an interference avoiding area can be ensured in a wide range as compared with local pressing such as that by the tie bands 20. Further, if the wiring harness WH is passed through the pressing portion 13 after being inserted through the protection tube 19, a situation where the wire coatings are damaged can be reliably avoided even if the end edges of the pressing portion 13 are edgy. Furthermore, since the pressing portion 13 is open sideways in this embodiment, an operation of inserting the wiring harness WH can be easily performed. Furthermore, in this embodiment, by arranging the pressing portion 13 in the low-level area 12 for the wiring harness WH passing through two areas with a height difference where the lift easily occurs, the lift can be effectively regulated. Further, since being forcibly bundled by the pressing portion 13, the wiring harness WH conversely tends to easily spread at the opposite sides of the pressing portion 13. However, since the wiring harness WH are tightened and fixed by the tie bands 20 at the opposite sides of the pressing portion 13 in this embodiment, the lift of the wiring harness WH can be regulated in a wider range by the cooperation with the pressing portion 13.

In the through holes 21A, 21B through which the band portion 23 of the tie band 20 is to be inserted, the early-inserted hole 21A and the later-inserted hole 21B have different hole edges and can be easily distinguished in external appearance, wherefore the insertion sequence of the band portion 23 through the through holes 21A, 21B can be correctly selected. Thus, the lock portion 25 and the wiring harness WH can be reliably pulled toward the space where the interference with the surrounding members can be avoided. In addition, since the semicircular area 22B is formed on the side opposite to the one toward which the wiring harness WH is pulled concerning the positional relationship between the semicircular area 22B and the rectangular area 22A of the through hole 21A, the band portion 23 can be located in the rectangular area 22A and the semicircular area 22B can be largely open. Therefore, an operator can detect that the tying operation has been properly performed by visually confirming such an open state in the early-inserted hole 21A. Further, since the extended part of the early-inserted hole 21A is formed into a rounded shape (semicircular shape), the band portion 23 is unlikely to be caught at the time of insertion and the tightening operation can be smoothly performed.

The present invention is not limited to the above described and illustrated embodiment. For example, the following embodiments are also included in the technical scope of the present invention.

The number and arrangement of the swaging pieces 36 are not limited to those in the above embodiment.

Although a target to be fixed by the swaging pieces 36 is the ROM 1 in the above embodiment, it may be another electrical component and may be, for example, a sensor, a connector or the like.

Although the receiving portion for the positioning protrusion 37 is a through hole like the receiving hole 39 in the above embodiment, there is no limitation to this and the receiving portion may be a non-penetrating recess.

Although the holding portion 33 is set on the free end part of the holding plate 2 in the above embodiment, it may be provided at an intermediate position of the holding plate 2. If such a configuration is adopted, the reinforcing rib 35 can be omitted even if the holding portion 33 is arranged via a step.

Although the pressing portion 13 is arranged only at one position in the above embodiment, it may be arranged at a plurality of positions. In such a case, the pressing portion 13 may be arranged on one side edge of the holding plate 2 and other pressing portion(s) 13 may be arranged on the other side edge and, further, the pressing portions 13 may be shifted in position in the longitudinal direction.

Although, out of the pair of through holes 21A, 21B, the early-inserted hole 21A is formed larger than the later-inserted hole 21B in the above embodiment, it may be conversely formed smaller.

LIST OF REFERENCE SIGNS

1 . . . ROM (electrical component)
2 . . . holding plate
33 . . . holding portion
35 . . . rib
36 . . . swaging piece
37 . . . positioning protrusion
38 . . . bent portion
39 . . . receiving hole (receiving portion)
U . . . wiring unit
WH . . . wiring harness

The invention claimed is:

1. A wiring unit for automatic transmission mounted in an automatic transmission of an automotive vehicle and configured to execute a control relating to a speed changing operation, comprising:
   electrical wiring;
   an electrical component connected to the electrical wiring; and
   a holding plate made of metal for holding the electrical wiring and the electrical component,
   wherein the holding plate is formed with a holding portion on which the electrical component is to be placed, and the holding portion is integrally formed with swaging pieces projecting from opposite first and second side edges of the holding portion for fixing the electrical component on the holding portion by being swaged to the electrical component;
   a positioning protrusion projects on the electrical component and a receiving portion with a continuous closed inner circumferential surface is formed in the holding portion, the positioning protrusion is fit in the receiving portion to position the electrical component; and
   the swaging pieces are arranged on the side edges of the holding portion to sandwich the electrical component between the swaging pieces, the swaging pieces provided on the first side edge and those provided on the second side edge differ in number and the receiving portion is arranged at a position of the holding portion near the side edge with fewer of the swaging pieces.

2. The wiring unit for automatic transmission of claim 1, wherein each of the swaging pieces is formed of a base portion standing from the holding portion and a swaging portion formed to be somewhat narrow at a tip side of the base portion and swageable to the electrical component.

3. The wiring unit for automatic transmission of claim 2, wherein the holding plate includes a free end part arranged via a bent portion, the holding portion is formed on the free end part and the bent portion is formed with a reinforcing rib in an area straddling the bent portion.

4. The wiring unit for automatic transmission of claim 1, wherein the holding plate includes a free end part arranged via a bent portion, the holding portion is formed on the free end part and the bent portion is formed with a reinforcing rib in an area straddling the bent portion.

* * * * *